(12) United States Patent
Pyne

(10) Patent No.: US 8,010,067 B2
(45) Date of Patent: Aug. 30, 2011

(54) LONG RANGE RFID TRANSMITTER POWER TRACKING LOOP

(75) Inventor: John W. Pyne, Erie, CO (US)

(73) Assignee: Goliath Solutions, LLC, Deerfield, IL (US)

( * ) Notice: Subject to any disclaimer, the term of this patent is extended or adjusted under 35 U.S.C. 154(b) by 790 days.

(21) Appl. No.: 11/581,310

(22) Filed: Oct. 16, 2006

(65) Prior Publication Data

US 2008/0088457 A1 Apr. 17, 2008

(51) Int. Cl.
*H01B 11/12* (2006.01)

(52) U.S. Cl. .......... 455/127.3; 455/41.1; 455/41.3; 455/404.2; 455/553.1; 455/127.1; 455/127.2; 455/456.1; 340/10.1

(58) Field of Classification Search ........... 455/404.2, 455/41.1, 553.1, 126, 127.1–127.3, 456, 455/41.3, 456.1, 91, 101, 103, 107, 114.1, 455/115.1–115.4, 123, 125, 127.2, 129; 340/10.1; 343/893
See application file for complete search history.

(56) References Cited

U.S. PATENT DOCUMENTS

| | | | | |
|---|---|---|---|---|
| 3,848,191 | A * | 11/1974 | Anderson | 375/345 |
| 6,313,737 | B1* | 11/2001 | Freeze et al. | 340/10.1 |
| 6,812,824 | B1* | 11/2004 | Goldinger et al. | 340/10.1 |
| 2002/0090958 | A1* | 7/2002 | Ovard et al. | 455/456 |
| 2003/0174099 | A1* | 9/2003 | Bauer et al. | 343/893 |
| 2005/0054293 | A1* | 3/2005 | Bann | 455/41.3 |
| 2008/0080549 | A1* | 4/2008 | Rofougaran | 370/458 |

OTHER PUBLICATIONS

International Search Report dated Apr. 9, 2008 from corresponding PCT Application No. PCT/US2007/021996 (1 pg.).

* cited by examiner

*Primary Examiner* — Junpeng Chen
(74) *Attorney, Agent, or Firm* — Jones Day

(57) ABSTRACT

A high power amplifier having an automatic gain control circuit, the high power amplifier being coupled between the output end of an RF signal carrying coaxial cable and a transmitting antenna to automatically compensate for RF signal attenuation over the length of the coaxial cable.

6 Claims, 3 Drawing Sheets

LONG RANGE RFID TRANSMITTER POWER TRACKING LOOP

BACKGROUND

1. Field

The technology described herein relates in general to long range transmission of RFID signals over coaxial cables to transmitter antennae and in particular to a system for maintaining a desired RF signal level at the input to an antenna by substantially compensating for attenuation effects over the coaxial cable length.

2. Related Art

In one of applicant's systems, as described in commonly-assigned U.S. patent application Ser. No. 11/254,250 which is incorporated hereby by reference, a single BRT (Backscatter Receiver/Transmitter)/hub (a Spider) with antennae attached to multiple transmit and receive ports by coaxial cable may be used to radiate instruction signals to tags associated with retail merchandise displays and receive RF signals from the tags over an entire establishment, such as a drug store, as well as a sizable portion of grocery and mass merchandising stores. Entire grocery and mass merchandise outlets can be covered by a small number of Spiders.

With the Spider described above, each of a plurality of RFID tags located in spaced relationship to the other RFID tags in a retail environment can be interrogated by transmitted signals and respond by radiating information concerning commercial goods with which it is associated.

Long Range RFID systems that are capable of determining the location of RFID tags within a retail environment should have consistent and predictable performance over a variety of conditions. Such conditions include coaxial cable specifications, electronics aging, and temperature variations. This is particularly important when considering the RF signals applied to the transmitter antennae in such systems.

A predictable and consistent Effective Radiated Isotropic Power (ERIP) will aid in the tag location determination. Applicant's present display monitoring system uses a central transmitter and receiver known as the Main Electronics Unit (MEU) that connects with remote active receive and transmit antennae via coaxial cable. As is well known, RF power transmitted over coaxial cable loses strength from the input to the output of the cable. Two parameters generally define the loss for a particular type of cable. These parameters are cable length and frequency of the RF signals transmitted over the coaxial cable.

It will be understood by those skilled in the art that the lengths of coaxial cables installed in long range RFID systems can vary from one installation to the next. In one system, a transmit antenna may be connected to the MEU with a 25' cable while in another system, an 85' cable (or longer) may be required. Applicant's display monitoring system presently operates in the 915 MHz ISM band. A typical loss for plenum rated coaxial cable is 0.15 dB/ft. This equates to a signal loss of 3.75 dB for a 25' coaxial cable and 12.75 dB for the 85' coaxial cable, a difference of 9 dB. This is a huge variation and creates an undesirable variable when computing RFID tag locations.

It would be desirable to have a power tracking loop (gain control system) incorporated into the transmitter antenna circuitry to address the power variation problem.

SUMMARY

In accordance with the teachings described herein, a long range RFID transmitter power tracking loop is provided. An RF signal circuit may be coupled between each output from a coaxial cable that carries RF signals from the MEU and each RF signal transmitter antenna for maintaining a desired RF signal strength that is provided to each one of at least two spaced transmitter antennae.

DC power for the RF signal circuit is provided on the coaxial cable with the RF signal. A regulator converts the DC (nominal 6 VDC) to 3.3 VDC. The RF input signals can range from +4 dBm to +18 dBm and are applied to a High Power Amplifier (HPA). The HPA has a nominal gain of +23 dB. This means that an RF input of +4 dBm will result in an amplified output of +27 dBm.

The amplified RF output signal is detected and coupled to a gain control circuit that provides a gain control signal to the high power amplifier (HPA) to enable a desired RF output signal strength to be maintained and coupled to the transmitting antenna.

The gain control circuit includes a comparator that compares a proportional DC signal (derived from the UHF RF signal at the output of the HPA) with a manually derived signal (set with a potentiometer) to cause a HIGH or LOW gain control signal to be applied to the HPA to enable a desired gain output signal to be generated. A HIGH or LOW gain control is necessary because one power level may cause too many tags to be read. Thus, by having a LOW gain signal, this problem can be corrected. Thus, with a given desired RF signal strength output of the HPA, the gain of the HPA can be automatically set to maintain that given desired RF signal strength output to the associated antenna.

It will be understood that, under these circumstances, if a 27 dB RF signal is desired to be applied to the transmitting antenna, the gain of the HPA can be set to provide a +27 dBm RF output signal regardless of the input RF signal strength (+4 dBm to +18 dBm). Thus, no matter how the coaxial cable attenuates the input RF signal, a desired output RF signal is applied to the antenna.

In one example, the technology described herein may maintain a desired RF signal level applied to a remotely located transmitting antenna that is derived from a coaxial cable that carries an RF signal that is attenuated over the length of the coaxial cable.

In another example, the technology described herein may detect the RF signal output level from the High Power Amplifier, convert that RF signal output level to a proportional DC signal level, provide a manually generated DC signal representing a desired RF signal output level from the High Power Amplifier, coupling the proportional DC signal level and the manually generated DC signal to a comparator that generates a gain control output signal, and using the gain control output signal to adjust the gain of the High Power Amplifier to cause it to generate the desired RF output signal level.

The technology described herein relates to a RF gain control circuit coupled between the output end of an RF signal carrying elongated coaxial cable and a receiving antenna to automatically compensate for RF signal attenuation occurring over the length of the coaxial cable thereby providing a desired output RF signal level to the receiving antenna.

The technology described herein also relates to a method of maintaining a desired output RF signal level to a remotely located receiving antenna comprising the steps of transmitting an input RF signal level over a coaxial cable that attenuates the input RF signal level; providing a gain control circuit at the output of the coaxial cable for receiving the attenuated RF signal level and providing a desired output RF signal level; and coupling the desired output RF signal level to the receiving antenna.

DETAILED DESCRIPTION OF THE DRAWINGS

Figure 1:
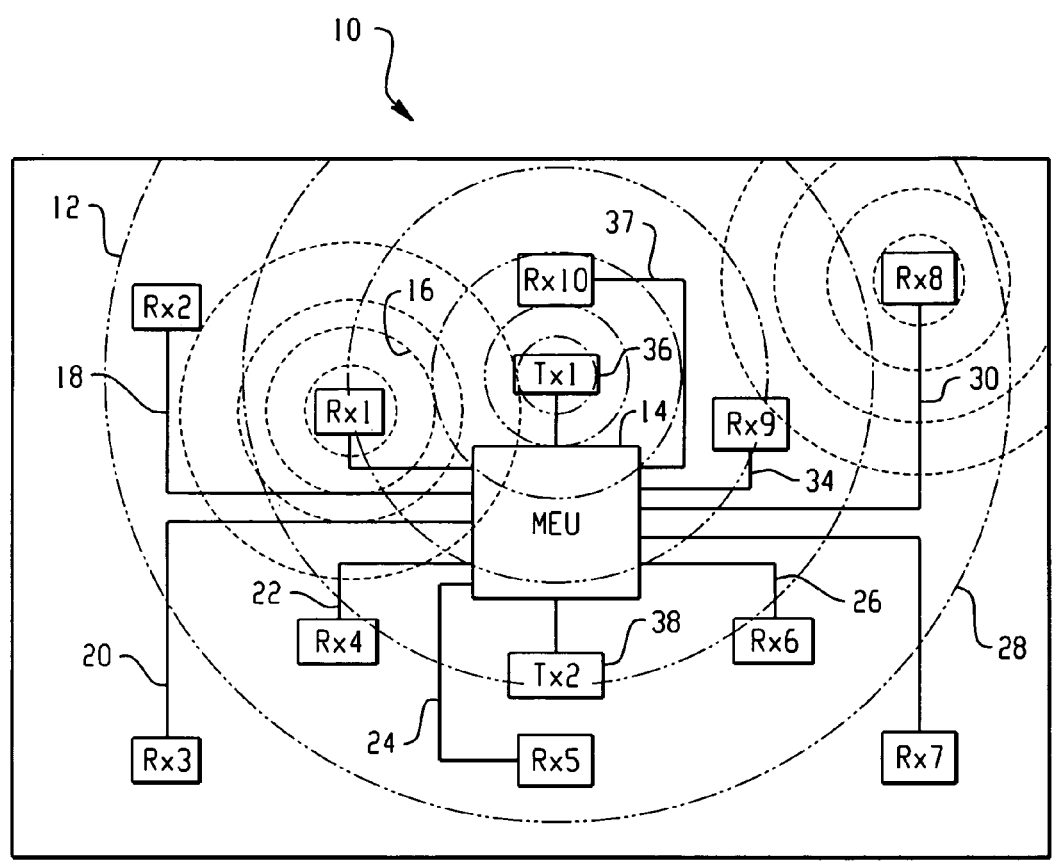
FIG. 1 is a block diagram of an example RF detection system.

FIG. 1 is a schematic block diagram representing one embodiment (spider) 10 of an RF detection system. The embodiment of FIG. 1, with the use of a plurality of separate RF receiving units, has already been disclosed in commonly assigned copending patent application Ser. No. 11/254,250, the subject matter of which is incorporated herein by reference in its entirety. A designated area 12 of a facility 10 contains a plurality of zones represented by backscatter receivers Rx1-Rx10. Transmitter antennae Tx1 and Tx2 (ports) are coupled by coaxial cable to a MEU (Main Electronics Unit) 14 that provides command signals used to illuminate RF tags in a given zone. The RF tag responsive signals are received by the receivers Rx1-Rx10. A single MEU 14 may be used to cover an entire store, such as a drug store, as well as a sizable portion of grocery and mass merchandising stores. Entire grocery and mass merchandising stores could be covered by a small number of spiders. Only one Tx unit and one Rx unit are active at any one time in this embodiment. The MEU 14 (Spider) scans a given pair of Tx/Rx units over 51 channels at fixed power levels until all Tx/Rx unit pairs have been covered. For example, only Tx1 and Rx1 are enabled. In such case, Tx1 illuminates RF tags within its range and only Rx1 receives the responses from the illuminated RF tags. Tx1 and Rx1 are successively scanned at 51 channels. The RF signals are coupled to and from the Tx/Rx units and the MEU 14 by coaxial cables 16-34.

The MEU 14 could then scan a different zone using Tx1 and Rx2, for example, or Tx1 and Rx8. This process is repeated until all zones are interrogated. Further, Tx1 36 and Tx2 38 can be the selected transmitter units designated by the MEU. Thus, in this embodiment, the reader/transmitter electronics are centralized and the required RF signals are transmitted over coaxial cables to and from selected transmitters/receivers. Tx ports may be connected to small quadrifiler antennas to produce even broader and more efficient transmission patterns than patch antennas currently used on Back scatter Reader/Transmitters. An example quadrifiler antenna that may be used with the technology described herein is described in commonly-owned U.S. patent Ser. No. 11/417,768, which is incorporated herein by reference in its entirety.

Figure 2:
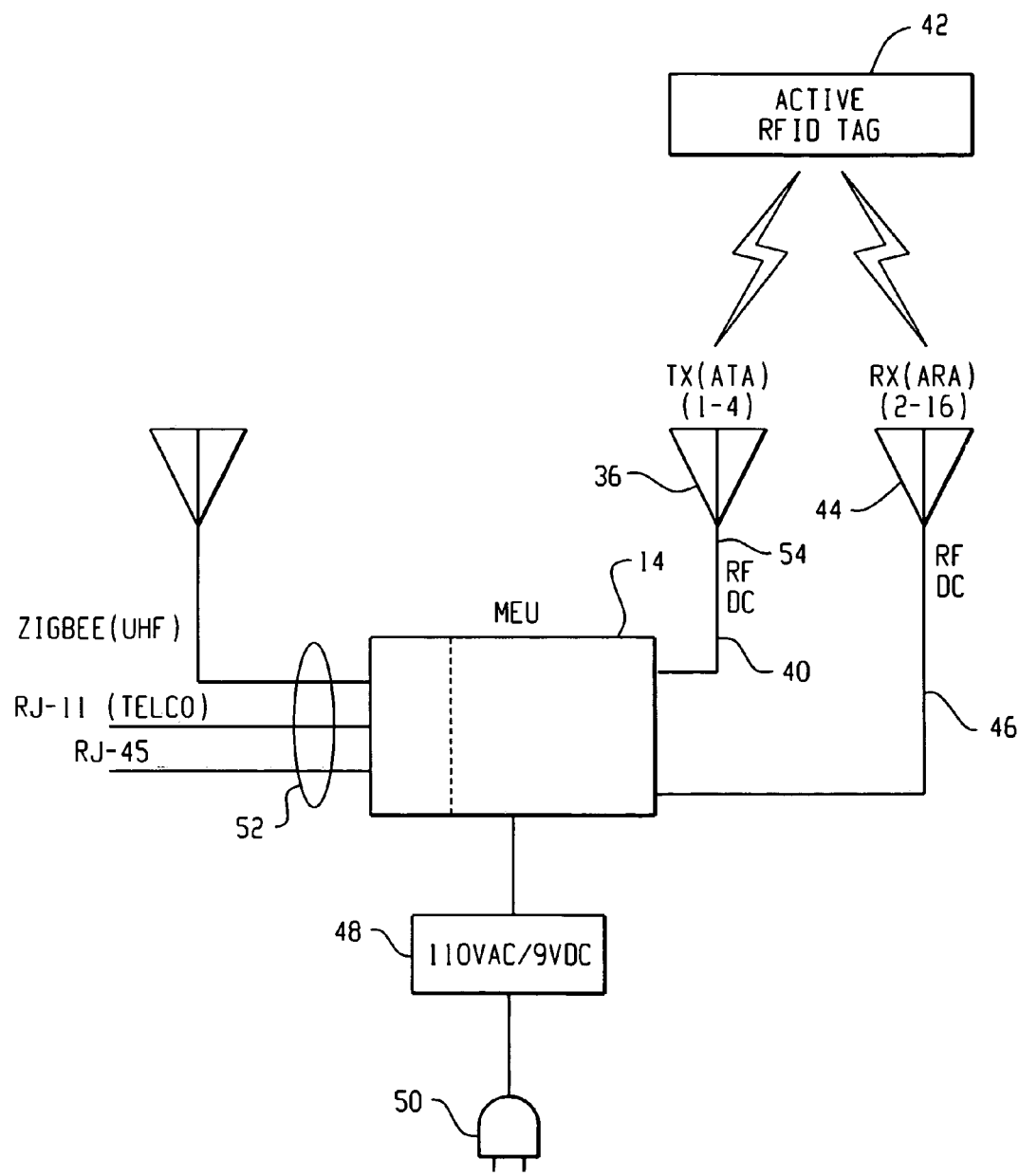
FIG. 2 is a simplified block diagram of the RF detection system of FIG. 1.

FIG. 2 is a simplified block diagram of the system of FIG. 1. The MEU 14 transmits RF signals to antenna 36 over coaxial cable 40. The antenna 36 radiates those RF signals to a battery assisted RFID Tag 42. Tag 42 periodically wakes and modulates its antenna to produce a backscatter signal to the CW wave from antenna 36 and receiving antenna 44 couples the tag 42 response back to the MEU 14 over coaxial cable 46. Other possible inputs to the MEU 14 are shown at 52. Further, it is also well known that the MEU 14 may be powered from an AC/DC converter 48 that receives its power from wall socket plug 50.

It will be understood that with as many as four (4) transmitting antennae positioned at different locations within a facility, the coaxial cable lengths may be different and therefore a differently attenuated signal will be supplied to each transmitting antenna. Such systems for determining tag location within a retail environment should have consistent and predictable performance over a wide variety of conditions. In addition, different lengths of coaxial cable attenuate a signal applied thereto differently.

Thus, to accommodate and compensate for such RF signal attenuation, an RF signal compensating network 54 is added between the antenna end of coaxial cable 40 and transmitting antenna 36. As will be described hereinafter in relation to FIG. 3, the compensating network 54 includes a gain control circuit that causes a desired RF signal level to be applied to the antenna 36 regardless of the attenuation of the RF signal at the antenna end of the coaxial cable.

Figure 3:
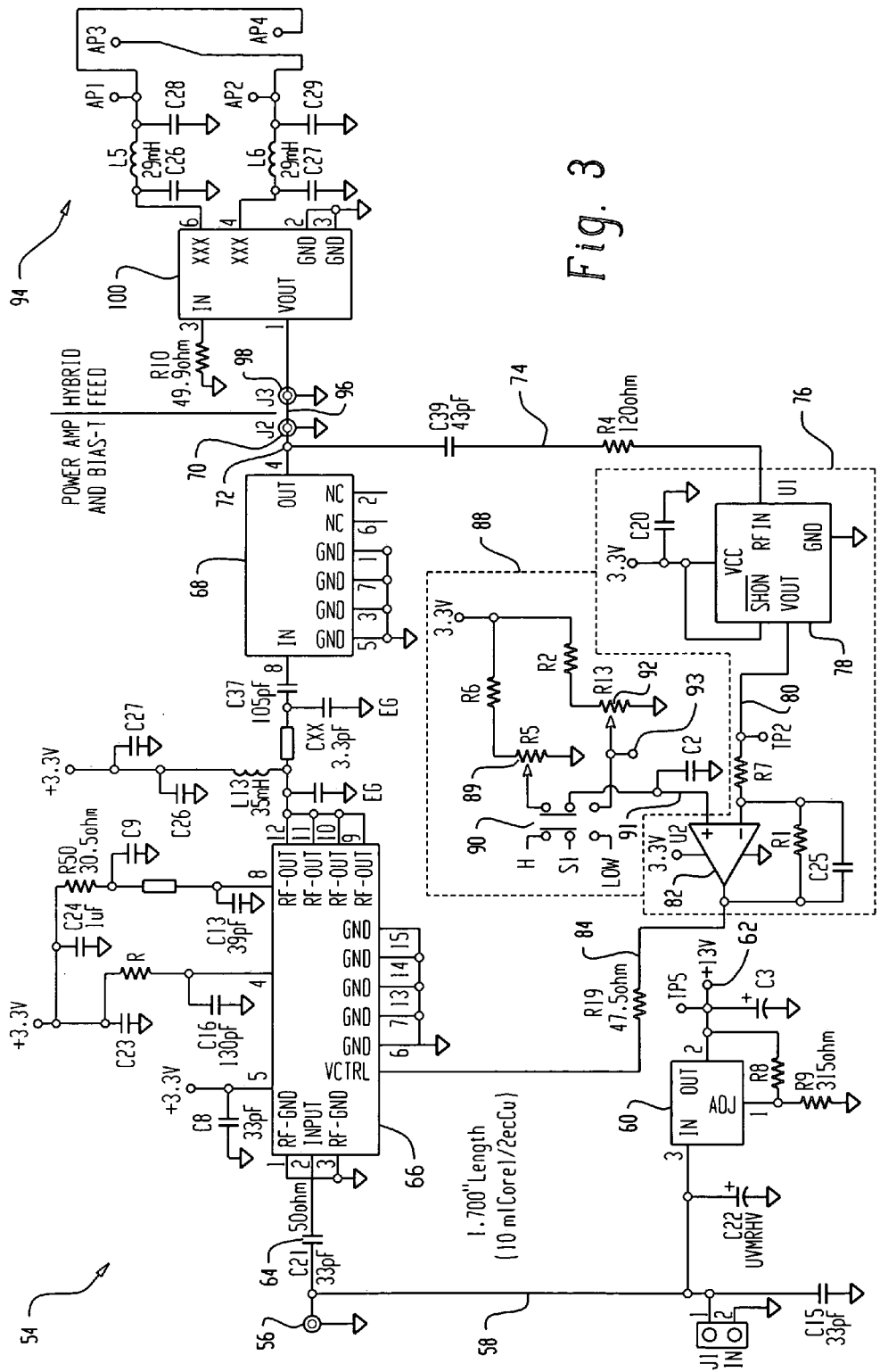
FIG. 3 is an electrical circuit diagram of an RF signal circuit that can be used to automatically compensate for the attenuation of RF signals sent to a transmitting antenna over a coaxial cable.

The RF signal compensating network 54 in FIG. 3 has an input jack 56 that receives the end of the coaxial cable from the MEU 14 that carries the RF signal to the antenna 36 and a 6 volt dc signal for powering the network 54. The dc signal is coupled on line 58 to regulator unit 60 that converts the 6 volt dc signal to a 3.3 volt dc signal at output terminal 62 for use in the remainder of the circuit 54 as shown.

The RF signal at jack 56 is coupled through capacitor 64 to High Power Amplifier 66. The output from the High Power Amplifier 66 is coupled through a Band Pass Filter 68 to an output jack 70. A node 72 couples the output RF signal from the High Power Amplifier on line 74 to an automatic gain control circuit 76. An RF signal detector 78 in automatic gain control circuit 76 converts the RF power output signal level at node 72 to a proportional dc signal on line 80. This proportional dc signal on line 80 representing the RF output signal level at node 72 is coupled to one input of a comparator 82. Comparator 82 is a gain control comparator and its output on line 84 represents a desired gain control signal to be applied to the High Power Amplifier 66 at its input port. To adjust the desired amount of gain to be applied to the High Power Amplifier 66 at its input port, a circuit 88 has a first adjustable gain control providing a HIGH gain and including a potentiometer 89 that has a manually adjustable arm 90 that can vary the dc voltage on line 91 that is coupled to the other input of the comparator 82 thereby providing a desired gain control signal to the high power amplifier gain control port (VCTRL) for enabling a desired RF output signal strength to be maintained and coupled to the transmitting antennae.

A second adjustable gain control in circuit is in parallel with the first adjustable gain circuit and provides a different gain control output signal to cause a different RF output signal from the high power amplifier 66 than that caused by the first adjustable gain control. The second adjustable gain control circuit forms a LOW gain circuit by means of potentiometer 92 and manually adjustable arm 93 that can also vary the dc voltage on line 91 to the other input of the comparator 82 to cause a lower gain. A switch, S1, can be used to select either the HIGH gain or the LOW gain level that is to be applied to the other input of the comparator 82. Thus, the gain control signal on line 84 to the input port (VCTRL) of the High Power Amplifier 66 can be adjusted or varied as either a HIGH or a LOW gain control signal by use of the potentiometers 89 or 92. Depending, therefore, on the signal attenuation at the output end of the coaxial cable 40 (FIG. 2), the gain of the High Power Amplifier 66 can be set to cause a desired RF signal level to be present at jack 70. Since the RF signal level at jack 70 is converted automatically to a proportional dc signal, if there is a variation in the RF signal level at jack 70, the gain control circuit 76 automatically varies the gain of the High Power Amplifier 66 to maintain the output RF signal level that is applied to transmitting antenna 94.

Thus, switch S1 allows two (2) RF power settings for the transmitter antenna. If, in the HIGH gain setting, too many tags are being read, switch S1 can be placed in the LOW gain position to correct that problem.

Once the gain of the High Power Amplifier 66 is set as explained above, a jumper 96 can be connected between jack 70 and jack 98 to couple the gain controlled RF signal to the antenna 94. Antenna 94 may be a quadrifiler antenna that is fed the signal by driver 100.

The RF signal attenuation varies with the length of the coaxial cable over which the RF signal is carried. Two examples are given as follows:

| EXAMPLE 1 Parameters: | |
|---|---|
| RF power output from the MEU 14 | +18 dBm |
| Cable length from MEU to antenna | 85 feet (12.75 dB loss) |
| Input Signal to antenna | +18 dBm − 12.75 dB loss = 5.25 dBm | loss

The input signal to the antenna is within the range of +4 to +18 dBm so the RF power leveling circuit (gain control circuit) 76 will automatically adjust the output RF power level to the antenna to +27 dBm.

| EXAMPLE 2 Parameters: | |
|---|---|
| RF power output from the MEU 14 | +21 dBm |
| Cable length from MEU to antenna | 25 feet (3.75 dB loss) |
| Input Signal to antenna | +21 dBm − 3.75 dB = 17.25 dBm |

Again, the input signal to the antenna is within the range of +4 to +18 dBm so the RF power leveling circuit (gain control circuit) 76 will automatically adjust the output RF power level to the antenna to +27 dBm.

It will be understood by those skilled in the art that larger format stores (retail establishments), greater power may be necessary to be applied to the transmit antennae while lower power may be applied to the transmit antennae in smaller format retail establishments such as drug stores. In order to reduce manufacturing costs for making two different power gain controls. the HIGH and LOW gain control circuit 88 is all that is needed and is very economical.

Thus, there has been disclosed a novel system and method for automatically compensating for RF signal transmission loss over a coaxial cable to a signal transmitting antenna. In systems where the coaxial cable length varies, the RF power received by the transmitting antenna varies and, in some cases, may adversely affect the operation of an RFID tag identification system in a retail establishment.

For instance, commonly assigned U.S. patent application Ser. No. 11/418,319, which is incorporated herein by reference in its entirety, describes systems and methods for determining the location of an RFID tag in an RFID system. The operation of such a location determination system may be adversely affected by signal attenuation in different lengths of cable feeding the transmission antennas because the location determination algorithms may require that the signal strengths of the RF signals broadcast from the transmission antennas are substantially the same. The systems and methods described herein may thus be used in such an RFID system to improve its location determination functions by helping to ensure that the signal strengths of the signals broadcast from each of the transmission antennas are substantially the same.

This written description uses examples to disclose the invention, including the best mode, and also to enable a person skilled in the art to make and use the invention. The patentable scope of the invention may include other examples that occur to those skilled in the art.

It is claimed:

1. An RFID system configured to determine a location of an RFID tag in a retail environment, comprising
   a central transmitter for generating the RF signal for transmission to the RFID tag;
   a first transmission antenna coupled to the central transmitter via a first transmission medium;
   a second transmission antenna coupled to the central transmitter via a second transmission medium;
   wherein the first transmission medium and the second transmission medium are cables of different lengths;
   a first RF signal compensating circuit coupled between the central transmitter and the first transmission antenna that applies a first variable gain to the RF signal to compensate for attenuation of the RF signal caused by the first transmission medium; and
   a second RF signal compensating circuit coupled between the central transmitter and the second transmission antenna that applies a second variable gain to the RF signal to compensate for attenuation of the RF signal caused by the second transmission medium;
   the first and second RF signal compensating circuits causing the first and second transmission antennas to broadcast the RF signal with substantially a same signal strength, the first and second RF signal compensating circuits each comprising:
   an automatic gain control circuit for automatically adjusting a gain applied to the RF signal to maintain the same signal strength at the transmission antennas, the automatic gain control circuit comprising:
   a first static gain control circuit for applying a first predetermined static gain to the RF signal;
   a second static gain control circuit, in parallel with the first gain control circuit, for applying a second predetermined static gain to the RF signal; and
   a switch configured to manually select either the first static gain control circuit or the second static gain control circuit to apply the first or second predetermined static gain to the RF signal.

2. The RFID system of claim 1, wherein the first static gain control circuit outputs a gain at a predetermined level and the second static gain control circuit outputs a gain at a second predetermined level lower than the predetermined level of the first static gain control circuit.

3. An RFID transmitter power tracking loop for use in RFID systems that are capable of determining locations of RFID tags within a given area comprising:
   a central transmitter within the given area for transmitting signals to at least two spaced apart transmitter antennae located within the given area;
   a coaxial cable connected between the central transmitter and each of the at least two spaced apart transmitter antennae; the coaxial cable for each of the at least two spaced apart transmitter antennae being of a different length and different attenuation; and
   an RF signal circuit coupled between each RF signal output from a central transmitter coaxial cable and each of the at least two spaced apart transmitter antenna for maintaining a predetermined static RF signal strength provided to each of the at least two spaced apart transmitter antenna regardless of RF signal attenuation over the coaxial cable;

each RF signal circuit comprising:

a high power amplifier for receiving the RF output signal from a given one of the central transmitter coaxial cables and providing an amplified RF signal to its associated transmitter antenna;

a gain control port associated with the high power amplifier for receiving a gain control signal for controlling a gain of the high power amplifier;

a gain control circuit that provides the gain control signal for enabling a desired RF output signal strength to be maintained and coupled to the associated transmitting antennae;

the gain control circuit comprising:

a comparator having first and second inputs;

a reference signal representing an actual RF signal output level of the high power amplifier coupled to the first input of the comparator;

a first adjustable gain control circuit including a manually set control signal representing a predetermined gain of the high power amplifier applied to the second input of the comparator such that an output of the comparator provides the predetermined gain to the high power amplifier; and a second adjustable gain control circuit coupled in parallel with the first adjustable gain control circuit for providing a different gain control output signal to cause a different predetermined RF output signal strength from the high power amplifier than the predetermined RF output signal strength caused by the first adjustable gain control circuit.

4. The RFID transmitter power tracking loop of claim 3 further comprising a variable potentiometer for providing the manually set control signal that is applied to the second comparator input.

5. The RFID transmitter power tracking loop of claim 4 further comprising:

a switch coupled between the first and second adjustable gain control circuits to enable manual selection of the manually set control signal or the different gain control output signal to be applied to a respective transmitter antenna.

6. A method of maintaining RF signal strength substantially constant at an output of one end of a plurality of coaxial cables of differing lengths connected to at least one transmitter antenna over a wide range of RF signal input levels caused by attenuations of RF signals depending upon the lengths of the plurality of coaxial cables carrying the RF signals to the at least one transmitter antenna comprising the steps of:

for each of the plurality of coaxial cables;

coupling one of the wide range of RF signal input levels to an input of an RF signal circuit whose output is coupled to the at least one a transmitter antenna;

detecting a RF signal output level generated at an output of the RF signal circuit for a given RF input signal dBm level and converting the detected RF signal output level to a proportional dc signal;

comparing the proportional dc signal representing the detected RF signal output level with a manually generated dc signal representing a desired RF dBm level to generate a gain control signal;

coupling the gain control signal to the RF signal circuit to cause a desired RF output signal to be generated at the output of the RF signal circuit for powering the at least one transmitter antenna over a wide range of RF signal input levels to the RF signal circuit that vary with length of the plurality of coaxial cables, signal frequency, coaxial cable specifications, electronics aging, and temperature variations, wherein the gain control signal is manually adjustable for each of the plurality of coaxial cables so as to maintain substantially a same constant RF signal strength at the output of each of the plurality of coaxial cables, wherein the comparing step further comprises the steps of:

coupling the proportional dc signal based on the detected RF output signal level from a high power amplifier in the RF signal circuit as one input to a comparator having first and second inputs;

providing the manually generated dc signal representing the desired RF dBm level to the other input of the comparator with a use of a first gain control circuit having a variable potentiometer that is manually adjusted;

coupling a second gain control circuit in parallel with the first gain control circuit;

adjusting a gain of the second gain control circuit to be different from a gain of the first gain control circuit; and coupling an output of a selected one of the first and second gain control circuits to the comparator.

* * * * *